United States Patent [19]

Via

[11] 4,038,164

[45] July 26, 1977

[54] PHOTOPOLYMERIZABLE ARYL AND HETEROCYCLIC GLYOXYLATE COMPOSITIONS AND PROCESS

[75] Inventor: Francis A. Via, Yorktown Heights, N.Y.

[73] Assignee: Stauffer Chemical Company, Westport, Conn.

[21] Appl. No.: 614,469

[22] Filed: Sept. 18, 1975

[51] Int. Cl.$^2$ .................... C08F 8/00; C08F 2/46
[52] U.S. Cl. .................... 204/159.15; 96/115 P; 204/159.18; 204/159.23; 204/159.24; 260/22 CB; 260/23 AR; 260/42.28; 260/42.29; 260/42.52; 260/830 R; 260/835; 260/837 R; 427/54

[58] Field of Search .................... 204/159.23, 159.24, 204/159.15, 159.18, 159.14; 96/115 P, 115 R

[56] References Cited

U.S. PATENT DOCUMENTS

| 3,888,671 | 6/1975 | Muzyczko et al. | 96/33 |
| 3,930,868 | 1/1976 | Muzyczko et al. | 90/115 P |

*Primary Examiner*—Richard B. Turer
*Attorney, Agent, or Firm*—Ellen P. Trevors; Daniel S. Ortiz

[57] ABSTRACT

The present invention relates to the use of arylglyoxalate, ring substituted arylglyoxalate and heterocyclic glyoxalate compounds as photoinitiators in the photopolymerization of monomeric and polymeric compositions under the influence of actinic radiation.

23 Claims, No Drawings

PHOTOPOLYMERIZABLE ARYL AND HETEROCYCLIC GLYOXYLATE COMPOSITIONS AND PROCESS

BACKGROUND OF THE INVENTION

Photopolymerization of unsaturated compositions wherein a photoinitiating compound is included in the polymerizable mass is well known in the art. The process has many advantages over thermal polymerization and is particularly useful where long holding life combined with rapid hardening at low temperature is desirable. Photoinitiating compounds must absorb light and utilize the energy so acquired to initiate polymerization.

A large number of compounds have been found useful as photoinitiators for the polymerization of unsaturated compounds. Among those heretofore in most common usage in industry are the benzoin ethers of primary and secondary alcohols such as methyl alcohol, ethyl alcohol, isopropyl alcohol and isobutyl alcohol. Also, compounds such as phenyl glyoxal and 1-phenyl butane-1,2-dione are disclosed as photosensitizers in U.S. Pat. No. 2,413,973. Additionally, various acetophenone compounds such as 2,2-diethoxyacetophenone are claimed to have photoinitiating capability in U.S. Pat. No. 3,715,293.

While particular industrial applications often dictate certain requisite characteristics, the primary determinants of universal application in the selection of a suitable photoinitiating compound are its level of reactivity and its effect upon storage stability when combined with the photopolymerizable medium wherein it is to function. This latter characteristic is significant in view of the desirability of one-component systems which will not gel prior to use.

While compounds in common use as photoinitiators do effect rates of polymerization which are industrially acceptable and render photopolymerization superior to thermal polymerization in various applications, methods of achieving increased polymerization rates with increased stability are constantly being sought. Improved photoinitiators are particularly desirable since photopolymerization techniques are gaining increasingly widespread acceptance due to the inherently lower equipment costs, reduction of volatile emissions and reduced energy consumption which attend their use.

Collaterally, the ethers of benzoin, which are widely used as photoinitiation compounds, are not wholly satisfactory with regard to the one-component system storage stability factor. Any unsaturated system to which a benzoin ether is added has considerably diminished dark storage stability and will gel prematurely. Various attempts have been made to remedy this deficiency of the benzoin compounds by including stabilizing additives in the polymerization system. Thus, U.S. Pat. No. 3,819,495 discloses the addition of organic chlorine containing compounds and copper compounds as a stabilization system while U.S. Pat. No. 3,819,496 teaches the use of organic chlorine compounds with iron and/or manganese compounds for that purpose. Many other stabilizers have been suggested and, while some improvements have been achieved in the stability of unsaturated systems containing benzoin-type photoinitiators, the necessity of incorporating stabilization compositions raises the cost of such systems appreciably while the results are still not wholly satisfactory.

Another highly desirable characteristic of a photoinitiating composition is its capacity to function acceptably in polymerizable systems which contain various pigments. This attribute is significant commercially because inorganic pigments are one of the prime components of surface coating systems and contribute directly to the usefulness of such systems by virtue of their protective function, their decorative or artistic function and other miscellaneous functions. The white opaque pigments, characterized by titanium dioxide, are the most important single group of pigments in use because of the predominance of white as a color and because of the need to use white pigments in producing many tints and light hues of color.

With regard to rate of polymerization, the resultant surface texture of the polymerized, pigmented coating and the effect of the photoinitiating compound on the color itself, none of the most widely used photoinitiating compounds is wholly acceptable in titanium dioxide pigmented unsaturated systems.

It is an object of the present invention to introduce the use of a novel class of polymerization photoinitiation compounds of enhanced reactivity.

Another object of the invention is to provide photoinitiatingcompounds which can be combined with unsaturated compounds to form one-component polymerizable systems not subject to premature gelation.

A further object of the invention is the provision of pigmented photopolymerizable compositions wherein a photoinitiator of the invention reacts acceptably while not adversely affecting the surface characteristics or the color of the resulting polymerized product.

SUMMARY OF THE INVENTION

This invention relates to the polymerization, under the influence of light, of compositions subject to addition polymerization. More specifically, the process of the invention relates to the use of a novel class of photopolymerization photoinitiators of the general formula:

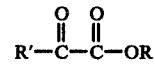

wherein R is a straight or branched chain hydrocarbon of from 1–10 carbon atoms, aryl, aralkyl or mono-, di- or trialkylsilyl and R' is a heterocyclic radical, aryl of 6 to 14 carbon atoms, phenyl or mono-, di- or polysubstituted phenyl with substituents selected from the group consisting of alkyl, alkoxy, aryloxy, alkylthio, arylthio and halogen.

In the foregoing definitions the term "straight or branched chain hydrocarbon of from 1 to 10 carbon atoms" refers to acyclic hydrocarbon groups which may contain unsaturated carbon-to-carbon bonds. The term "aryl", which unmodified indicates an aromatic hydrocarbon of 6 carbon atoms while "aralkyl" refers to a 6 carbon aromatic hydrocarbon containing a straight chain saturated hydrocarbon substituent of from 1 to 3 carbon atoms and being ethereally bonded to the carbonyl group thereby. The alkyl groups bonded to silicon are lower alkyl of from 1-to 3 carbon atoms. The term "aryl of from 6 to 14 carbon atoms" refers to mono- or polycyclic aromatic substituents such as phenyl, biphenyl, naphthyl, anthracyl, tolyl, xylyl, methoxyphenyl, nitrophenyl, etc. Regarding the phenyl substituents, all alkyl groups, whether directly bonded to the aromatic group or bonded thereto by oxygen or sulfur are straight or branched chain hydrocarbons of 1 to 5 carbon atoms. The term "aryl-" in "aryloxy" and "arylthio" refers to phenyl. The term "heterocyclic radical" indicates a five to six membered cyclic nucleus which may contain up to two atoms of oxygen, nitrogen or sulfur, or combinations thereof, in addition to carbon. The halogen atoms can be any of the four halogens, fluorine, chlorine, bromine or iodine.

The compositions curable by actinic radiation according to the invention can contain a photopolymerizable polymer in a rective ethylenically unsaturated monomeric medium, a reactive polymer alone, a reactive monomer alone, or any of these combined with an inert solvent. Additionally, the polymerizable composition can contain any of the pigments commonly used in photopolymerization techniques.

The process can be carried out by mixing a quantity of a photoinitiating compound of the invention with a photopolymerizable composition and exposing the resultant mixture to actinic radiation. Alternatively, a one-component system comprising the photopolymerizable composition, the photoinitiator of the invention and, if desired, pigmentation, can be stored in the dark for a prolonged period of time prior to use without fear of gelation.

DESCRIPTION OF THE INVENTION

The utility of the present invention resides in the capability of the disclosed class of novel photoinitiating compounds to provide markedly enhanced reactivity over known compounds and to make available, darkstable, one-component photopolymerization systems without the need for stabilizing additives. Additional utility is found in the satisfactory performance of the compounds of the invention in pigmented systems in general and, in particular, in titanium dioxide pigmented systems.

The photoinitiating compounds of the invention have proven to be very suitable in the actinic light curing of unsaturated monomeric compounds either alone or as copolymerizable constituents of unsaturated polymer-/monomer systems. Such systems are composed of mixtures of conventional unsaturated polymers and unsaturated monomers.

Monomers which are useful in practicing the invention are acrylic, α-alkacrylic and α-chloroacrylic acid compounds such as esters, amides and nitriles. Examples of such compounds are acrylonitrile, methacrylonitrile, methyl acrylate, ethyl acrylate, methyl methacrylate, isobutyl methacrylate, 2-ethylhexyl acrylate, methacrylamide and methyl α-chloroacrylate. Also useful, although not preferred due to their slower rates of reactivity, are vinyl and vinylidene esters, ethers and ketones. Additionally, compounds having more than one terminal unsaturation can be used. Examples of these include diallyl phthalate, diallyl maleate, diallyl fumarate, triallyl cyanurate, triallyl phosphate, ethylene glycol dimethacrylate, glycerol trimethacrylate, pentaerythritol triacrylate, pentaarythritol tetraacrylate, trimethylolpropane triacrylate, methacrylic anhydride and allyl ethers of monohydroxy or polyhydroxy compounds such as ethylene glycol diallyl ether, pentaerthritol tetraallyl ether, and the like. Non-terminally unsaturated compounds such as diethyl fumarate can similarly be used.

The acrylic acid derivitives are particularly well suited to the practice of the invention and are consequently preferred components as monomers in monomer-containing polymerizable systems and as reactive centers in polymerizable polymers. While monomeric styrene can be used in the practice of the invention, it is not a preferred constituent of systems polymerizable thereby due to its slow rate of reaction.

A preferred manner of practicing the invention is by the use of photopolymerizable molding and coating compositions which consist of mixtures of unsaturated polymeric compounds and monomeric compounds copolymerizable therewith. The polymeric compounds can be conventional polyesters prepared from unsaturated polycarboxylic acids such as maleic acid, fumaric acid, glutaconic acid, itaconic acid, citraconic acid, mesaconic acid and the like, and polyhydric alcohols such as ethylene glycol, diethylene glycol, glycerol, propylene glycol, 1,2-butanediol, 1,4-butanediol, pentaerythritol, trimethylolpropane and the like. The carboxylic acid content can also contain saturated components. The inclusion of a monobasic fatty acid content, either as such or in the form of a triglyceride or oil, in the photopolymerizable polyester composition to comprise an alkyd resin is also acceptable. These resins can, in turn, be modified by silicones, epoxides, isocyanates, etc., by known techniques.

Additionally, the photopolymerizable composition can contain a sensitizer capable of enhancing the photoinitiating reactivity of the photoinitiating compound of the invention by triplet sensitization. Examples of sensitizers useful in the practice of the invention are such compounds as biphenyl, xanthone, thioxanthone, acetophenone and the like. These are typically added in amounts ranging from about 0.1 to about 6 weight percent. The techniques whereby such sensitizers are selected for use in conjunction with particular photoinitiators are well known in the art. See, for example, MUROV, Handbook of Photochemistry, Marcel Dekker, Inc., New York (1973).

Thus it is seen that the constitution of photopolymerizable compositions which can be used in the practice of the invention is widely variable. However, the compounds enumerated above are purely illustrative. Materials subject to polymerization by actinic radiation as well as permissable variations and substitutions of equivalent components within particular types of compositions are well known to those skilled in the art.

The photoinitiating compounds of the invention are esters of heterocyclic substituted glyoxalic acid, esters of arylglyoxalic acid and ring substituted derivatives thereof. These compounds are known and may be readily prepared by the methods set forth in U.S. Pat. No. 3,532,737. Alternatively, the procedures of U.S. Pat. No. 3,065,259 can be followed. A preferred representative of the novel photoinitiators of the invention is the methyl ester of phenylglyoxalic acid. In addition to the methods indicated above, this compound can be prepared easily by the reaction of methyl oxalyl chloride with benzene in the presence of aluminum trichloride or by the oxidation of mandelic acid to phenylglyoxalic acid and subsequent esterification with methyl alcohol.

The photoinitiators of the invention can be utilized in amounts ranging from 0.01 to about 30% by weight based on the photopolymerizable composition. However, preferable amounts of the compounds are between 0.5 and 20 weight percent with optimal results being achieved with amounts in the range of 1.0 to about 16 weight percent.

An acceptable source of actinic light radiation is any apparatus which emits light radiation in the approximate region of about 2000 Angstroms to about 8000 Angstroms and preferably between about 2400 Angstroms and 5400 Angstroms. One such apparatus is PPG Model QC 1202 AN UV Processor manufactured by PPG Industries, Inc.

The radiation source for this apparatus consists of two high intensity, medium pressure quartz mercury lamps 12 inches in length and each operating at a linear power density of about 200 watts per inch or 2400 watts per lamp. The lamps are housed in an eliptical reflector above a variable speed conveyor belt and each lamp provides a 2-inch band of high flux actinic radiation on the conveyor. This 2-inch exposure area is bordered on both sides by an additional 2-inch area of medium flux energy for a total radiation area of 6 inches for each lamp. In the curing data presented below, cure rate of the polymerizable compositions is presented in feet-per-minute-per-lamp (ft./min./lamp). Thus, a conveyor belt speed of one foot/min. will, with a 12-inch exposure area for the two lamps, provide 60 seconds of exposure or a cure rate of 0.5 ft./min./lamp. Similarly, a belt speed of 10 ft./min. will provide 6 seconds of exposure or a rate of 5.0 ft./min./lamp while a speed of 20.0 ft./min. will give 3 seconds exposure or a rate of 10 ft./mi./lamp, etc.

Extent of curing was determined by a standard pencil hardness test with all samples being coated on steel plate to a thickness of 2 mils and polymerized to achieve a standard pencil hardness between 4H and 6H where this was attainable.

The examples which follow will further illustrate the invention.

EXAMPLE 1

This example illustrates the effect of concentration of a preferred embodiment of the invention, namely, methyl phenylglyoxalate on the induced rate of photopolymerization of a standard test solution of acrylate/alkyd resin composition. This standard test solution consists of 42% by weight of trimethylolpropane triacrylate (TMPTA), 17% by weight of ethylhexyl acrylate (EHA) and 41% by weight of an unsaturated long oil linseed oil alkyd resin.

| CONCENTRATION OF METHYL PHENYLGLYOXALATE (Wt %) | CURE RATE (Ft./min./lamp) |
| --- | --- |
| 1.0 | 4 |
| 2.0 | 8 |
| 4.0 | 15 |
| 8.0 | 35 |
| 12.0 | 40 |
| 16.0 | 45 |
| 20.0 | 45 |

EXAMPLE 2

This example illustrates the dark-storage stability of various one-component photopolymerizable systems wherein different photoinitiating compounds have been incorporated. The systems consist of benzoin isobutyl ether or methyl phenylglyoxalate combined with various photopolymerizable monomers or with monomer/polymer combinations. The two polymers used in this example are EPOCRYL Resin DRH-303, a diacrylate ester of Bisphenol A Epoxy Resin, available from Shell Chemical Company and UVIMER Resin 540, composed of 49 parts urethane oligomer B, 19 parts hydroxyethyl acrylate and 32 parts pentaerythritol tetraacrylate, available from Polychrome Corporation. The quantity of initiator used was 1.2 weight percent in the case of the monomer/polymer systems as well as for the pentaerythritol triacrylate (PEA) monomer systems and 3.7 weight percent in the TMPTA monomer systems. Storage stability was measured in days at 65° C.

| | Storage Stability | (Days at 65° C.) |
| --- | --- | --- |
| Polymerizable Component | benzoin isobutyl ether | Methyl Phenylglyoxalate |
| TMPTA | <1*** | 70 |
| PEA | <1 | 100-IP** |
| TMPTA/UVIMER* Resin 540 | <1 | 50-IP |
| TMPTA/EPOCRYL* Resin DRH-303 | <1 | 50-IP |

* 50 weight percent of each component
** IP indicates test still in progress with no indication of gelation.
*** <indicates "less than"

EXAMPLE 3

This example illustrates the photoefficiency of the methyl ester and ethyl ester embodiments of the invention as compared with various other photoinitiators. The composition polymerized was the standard test solution of Example 1 and photopolymerization was achieved as described, utilizing the PPG Industries curing unit. A quantity of 4 weight percent of photoinitiator was used in each case.

| Photoinitiator | Cure Rate (Air) Ft./Min./Lamp |
| --- | --- |
| Methyl phenylglyoxalate | 15 |
| Ethyl phenylglyoxalate | 10 |
| p-terbutyl-$\alpha,\alpha,\alpha$-trichloroacetophenone | 5 |
| Valerophenone | 2.5 |
| $\alpha,\alpha$-Diethoxyacetophenone | 7.5 |
| $\alpha$-Methoxyacetaophenone | 2.5 |
| 1-benzoyl acetone | 0 |
| 1-phenyl-1,2-propane dione-2-oxime | 2.5 |
| benzoin Methyl Ether | 7.5 |
| benzoin Ethyl Ether | 7.5 |
| benzoin isopropyl Ether | 7.5 |
| benzoin Sec-butyl Ether | 7.5 |
| benzoin isobutyl Ether | 7.5 |
| benzoin benzyl Ether | 7.5 |

EXAMPLE 4

The following example compares the photoefficiency of various ring substituted embodiments of the invention with that of several dione photoinitiators. The procedure, materials and quantities were as stated in Example 3.

| Photoinitiator | Cure Rate (Air) Ft./Min./Lamp |
| --- | --- |
| Ethyl-p-methylthio phenylglyoxalate | 12 |
| Ethyl-p-phenylthio phenylglyoxalate | 11 |
| Ethyl-p-methoxy phenylglyoxalate | 10 |
| 1-phenyl propane-1,2-dione | 8 |
| Benzil | 7.5 |
| 4,4'-bis(methoxy)-benzil | 2.5 |
| 4,4'-bis(methyl)-benzil | 6 |
| 9,10-phenanthraquinone | 5 |
| Acenaphthenequinone | 3.3 |
| 1,2-naphthoquinone | 0 |
| N,N-diethyl benzoyl formamide | 5 |

EXAMPLE 5

This example compares the photoinitiating efficiency of methyl phenylglyoxalate and benzoin isobutyl ether in various polymerizable systems. The polyester component referred to in this example is a standard, commercial unsaturated polyester and both photoinitiators were used at 4 weight percent.

| Polymerizable Formulation | Cure Rate (Air) Ft./Min./Lamp | |
|---|---|---|
| | Methyl phenyl-glyoxalate | Benzoin isobutyl Ether |
| TMPTA/UVIMER 540 Resin* | 25 | 10 |
| TMPTA/EPOCRYL Resin DRH-303* | 50 | 30 |
| PETA*** | 60 | 20 |
| PEA | 45 | 25 |
| TMPTA/Polyester** | 20 | 7 |
| TMPTA | 10 | 7 |

*50 weight percent of each component
**80 weight percent TMPTA; 20 weight percent polyester.
***Pentaerythritol tetraacrylate

EXAMPLE 6

This example sets forth the photoefficiency of additional embodiments of the invention when tested at 4 weight percent loading in the standard test solution of Example 1 with curing as indicated with the PPG Industries unit.

| Photoinitiator | Cure Rate (Air) Ft./Min./Lamp |
|---|---|
| Ethyl-2-Furanglyoxalate | 15 |
| Ethyl-p-phenoxyphenylglyoxalate | 10 |
| Benzyl phenylglyoxalate | 9 |
| Allyl phenylglyoxalate | 8 |
| trimethylsilyl phenylglyoxalate | 7 |
| tert-butyl phenylglyoxalate | 5 |
| phenyl phenylglyoxalate | 2 |
| Ethyl-p-ethylphenylglyoxalate | 9 |
| Ethyl-2,4-dimethoxyphenylglyoxalate | 4 |
| Ethyl-2,4,6-trimethylphenylglyoxalate | 3 |
| Ethyl Naphthylglyoxalate | 6 |
| Ethyl-p-phenylphenylglyoxalate | 6 |

EXAMPLE 7

This example illustrates the comparative performance of methyl phenylglyoxalate and various other photoinitiators in titanium dioxide pigmented systems with regard to cure rate, surface texture of the polymerized coating and color. Standard test procedure was followed. The additions to the standard test solution of Example 1 were 15 weight percent of titanium dioxide pigment (TI-PURE R 900: DuPont) and 4 weight percent of each photoinitiator candidate.

| Photoinitiator | Cure Rate (Air) Ft/Min/Lamp | Surface Texture | Color |
|---|---|---|---|
| 2-chlorothioxanthone/ dimethylethanol amine* | 25 | Acceptable | Yellow |
| methyl phenylglyoxalate | 5 | Acceptable | White |
| benzophenone/Michler's ketone** | 5 | Acceptable | Yellow |
| benzil | 2.5 | Wrinkled | White |
| 4,4'-bis(methoxy)-benzil | 2.5 | Wrinkled | Yellow |
| 1-phenyl propane-1,2-dione | 2.5 | Wrinkled | Yellow |
| α,α-diethoxyacetophenone | 2.5 | Wrinkled | White |
| benzoin isobutyl ether | 2 | Wrinkled | White |
| 4,4'-dimethoxy benzoin isobutyl ether | 5 | Wrinkled | Yellow |

*50 weight percent of each component
**87.5:12.5 weight percent benzophenone to Michler's ketone.

What is claimed is:

1. In the polypolymerization of monomeric and polymeric compositions of photopolymerizable substances wherein a photoinitiator is admixed with a photopolymerizable composition and the mixture exposed to actinic radiation, the improvement wherein photopolymerization is effectively initiated by a compound of the formula:

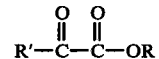

wherein R is straight or branched chain hydrocarbon of from one to ten carbon atoms, aryl, aralkyl, or mono-, di or trialkylsilyl and R' is a heterocyclic radical, aryl of from 6 to 14 carbon atoms or mono-, di- or polysubstituted phenyl with substituents selected from the group consisting of alkyl, alkoxy, aryloxy, alkylthio, arylthio and halogen, said photoinitiator being present in said composition at a concentration of 0.01 to about 30 weight percent.

2. The method of claim 1 wherein the photoinitiating compound is methyl phenylglyoxalate.

3. The method of claim 2 wherein the photopolymerizable substance additionally contains a pigmentation additive.

4. The method of claim 3 wherein the pigmentation additive is titanium dioxide.

5. The method of claim 1 wherein the photoinitiating compound is ethyl phenylglyoxalate.

6. The method of claim 1 wherein the photoinitiating compound is tertiary butyl phenylglyoxalate.

7. The method of claim 1 wherein the photoinitiating compound is benzyl phenylglyoxalate.

8. The method of claim 1 wherein the photoinitiating compound is trimethylsilyl phenylglyoxalate.

9. The method of claim 1 wherein the photoinitiating compound is allyl phenylglyoxalate.

10. The method of claim 1 wherein the photoinitiating compound is ethyl-p-ethylphenylglyoxalate.

11. The method of claim 1 wherein the photoinitiating compound is ethyl-p-phenylphenylglyoxalate.

12. The method of claim 1 wherein the photoinitiating compound is ethyl naphthylglyoxalate.

13. The method of claim 1 wherein the photoinitiating compound is ethyl-p-phenoxyphenylglyoxalate.

14. The method of claim 1 wherein the photoinitiating compound is ethyl-p-methylthio phenylglyoxalate.

15. The method of claim 1 wherein the photoinitiating compound is ethyl-p-phenylthio phenylglyoxalate.

16. The method of claim 1 wherein the photoinitiating compound is present at a concentration of about 0.5 percent by weight to about 16 percent by weight.

17. The method of claim 1 wherein the photoinitiating compound is present at a concentration of about 1.0 percent by weight to about 16 percent by weight.

18. A composition photopolymerizable by actinic radiation comprising unsaturated polymerizable constituents containing dispersed therein from 0.01 to 30 weight percent of a photoinitiating compound of the formula:

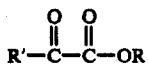

wherein R is straight or branched chain hydrocarbon of from one to ten carbon atoms, aryl, aralkyl, or mono-, di- or trialkylsilyl and R' is a heterocyclic radical, aryl of from 6 to 14 carbon atoms or mono-, di- or polysubstituted phenyl with substituents selected from the group consisting or alkyl, alkoxy, aryloxy, alkylthio, arylthio, and halogen.

19. The composition of claim 18 which additionally contains a photosensitizer.

20. The composition of claim 18 wherein the unsaturated polymerizable constituents consist essentially of derivatives of acrylic acid.

21. The composition of claim 18 wherein the photoinitiating compound is methyl phenylglyoxalate.

22. The composition of claim 21 which additionally contains a pigmentation additive.

23. The composition of claim 22 wherein said pigmentation additive is titanium dioxide.

* * * * *